United States Patent [19]
Buss

[11] 3,946,248
[45] Mar. 23, 1976

[54] DISPERSION COMPENSATED CIRCUITRY FOR ANALOG CHARGED SYSTEMS

[75] Inventor: Dennis Darcy Buss, Richardson, Tex.

[73] Assignee: Texas Instruments Inc., Dallas, Tex.

[22] Filed: July 12, 1974

[21] Appl. No.: 486,536

Related U.S. Application Data
[62] Division of Ser. No. 320,347, Jan. 2, 1973, Pat. No. 3,868,516.

[52] U.S. Cl. ........... 307/221 D; 307/304; 333/70 T; 357/24
[51] Int. Cl.² .................. H01L 27/10; H01L 29/78; G11C 11/40
[58] Field of Search ......... 333/18, 70 T; 307/221 R, 307/221 C, 221 D, 304; 357/24

[56] References Cited
UNITED STATES PATENTS
3,569,873  3/1971  Beaver .............................. 333/18 X OTHER PUBLICATIONS
Boonstra et al., "Analog Functions Fit Neatly Onto Charge Transport Chips", *Electronics*, Feb. 28, 1972, pp. 64–68.

*Primary Examiner*—William D. Larkins
*Attorney, Agent, or Firm*—Hal Levine; James T. Comfort; Richard L. Donaldson

[57] ABSTRACT

Circuitry for compensating for charge transfer inefficiency related dispersion in analog charge transfer devices (CTD's) is disclosed. In one aspect of the invention the tap weights of a filter are modified in a preselected manner to provide dispersion correction. In a different configuration, a dispersion compensating filter is connected to the input of a charge transfer delay line to provide an initial signal which is the inverse of the total dispersion of the CTD. In a further aspect of the invention regenerators are inserted into a CTD delay line to provide negative feedback to previous stages of the delay line in order to compensate for dispersion.

8 Claims, 17 Drawing Figures

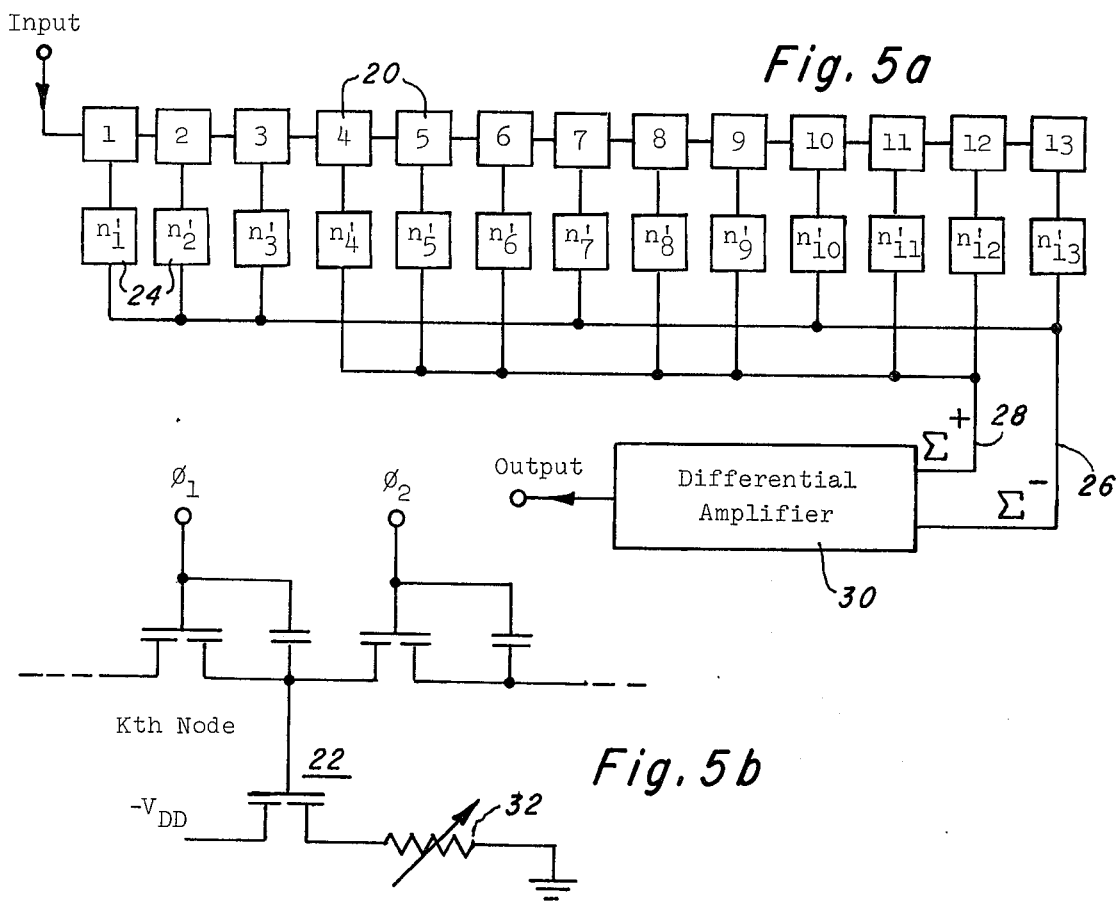
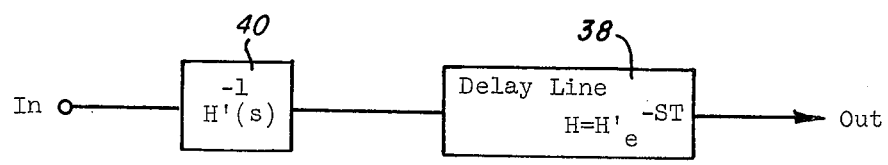
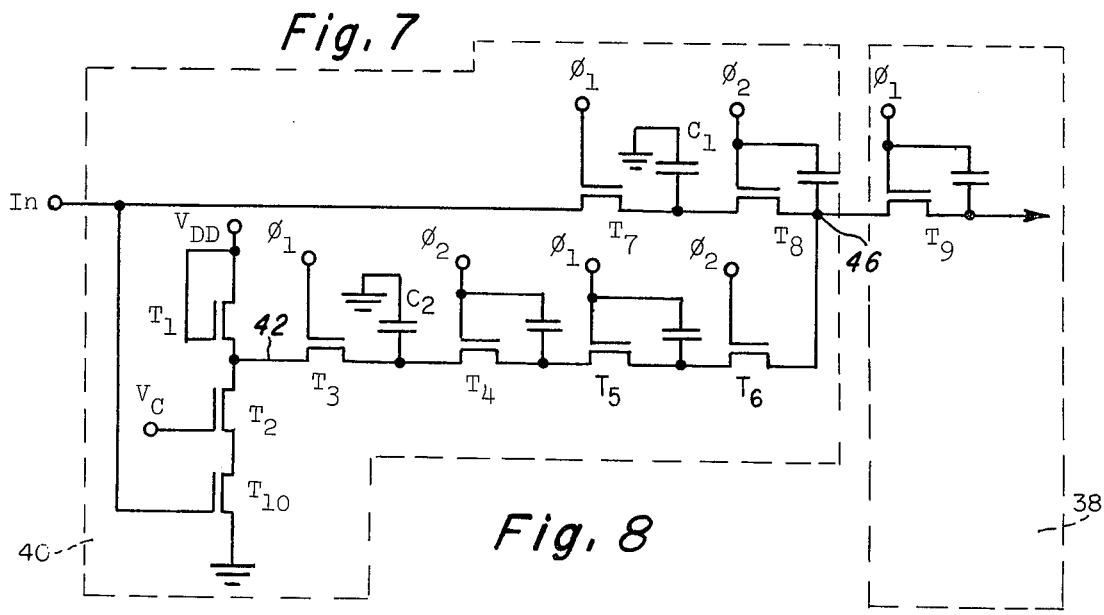

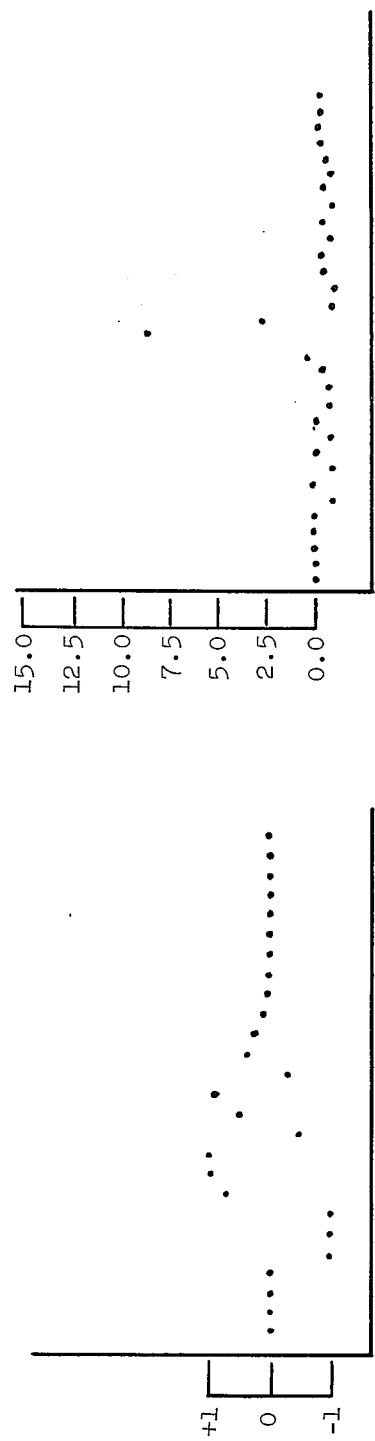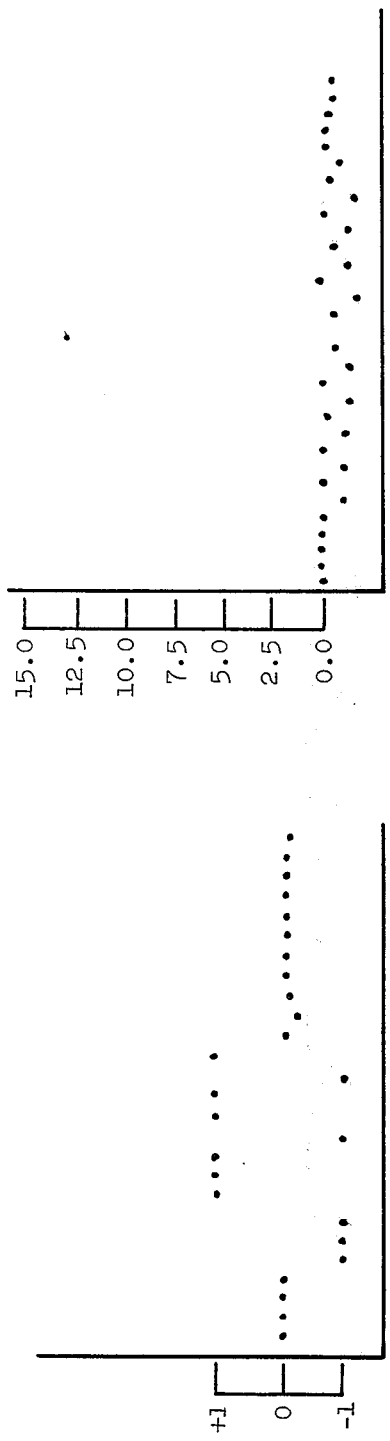

DISPERSION COMPENSATED CIRCUITRY FOR ANALOG CHARGED SYSTEMS

This is a division of application Ser. No. 320,347, filed Jan. 2, 1973, now U.S. Pat. No. 3,868,516.

The present invention pertains to analog delay lines in general, and more particularly to bucket brigade and charge coupled device analog delay lines having means connected thereto for compensating for dispersion produced by charge transfer inefficiency.

An analog matched filter can be defined using semiconductor charge transfer device configurations such as bucket brigades. In general a bucket brigade device is an insulted-gate, field effect transistor with a two-phase transfer mode. Storage sites are offset p-regions under metal insulator semiconductor capacitors. Since no contact is made with these diffusions, which form islands in the semiconductor substrate, charge must be transferred by manipulation of the potential on adjacent electrodes.

A bucket brigade device operates in the two transfer mode. In the storage mode all electrodes are at the same potential. In the transfer mode the potential on one electrode is made large enough to reduce the potential barrier and let charge flow from one p-region to the next. This process is repeated until the charge is transferred through the device in normal shift register action. A more detailed description of bucket brigades can be found in Altman, "Bucket Brigade Devices Pass From Principle to Prototype", *Electronics*, Feb. 28, 1972.

In defining a matched filter, the signal is sampled at each of the delay stages and the sampled signal is multiplied by a preselected tap weight $h_i$. The resultant signals are then summed at the output. Such matched filters are used to detect a given waveform in the presence of noise with optimum detection probability. Charge transfer device matched filters are useful, for example, in low data rate, spread spectrum communication systems where channel bandwidths are small.

If the delay stages are ideal, the tap weights $h_i = h(t_i)$ are the values of the impulse response sampled at times $t_i$ and the impulse response $h(t)$ is simply the time reverse of the signal to which the filter is matched.

In a bucket brigade device (BBD) or a charge coupled device (CCD), generically referred to as charge transfer devices (CTDs), the delay stages are not ideal due to imperfect charge transfer efficiency, and the performance of the device as a matched filter is degraded by the dispersion if the tap weights are chosen as in the case of ideal delay. In other words, a CTD delay line has dispersion in the sense that the impulse response is not an impulse delayed in time, but rather is a distorted impulse. By way of illustration, the system function $H(s)$ can be written:

$$H(s) = H'(s)e^{-sT}$$

where T is the desired delay and an ideal delay line would have a system function $e^{-sT}$. The $H'(s)$ represent the distorted system function.

Dispersion can also be considered in the time domain where the effect on an impulse in the delay line can be described as follows. The main pulse is attenuated and the lost amplitude of the pulse appears as subsequent (trailing) smaller pulses which decrease in amplitude away from the main pulse. In some of the examples of the invention described herein, only the main pulse attenuation and the first trailing pulse are discussed because in many cases of practical interest, only these effects are of importance. Furthermore, only the trailing pulses need to be eliminated to achieve ideal performance because the attenuation of the main pulse can be compensated by a simple amplifier.

Accordingly, an object of the invention is the provision of a charge transfer device analog delay line having means connected thereto for compensating for dispersion.

A further object of the invention is a CTD analog matched filter wherein the respective tap weights are modified in a preselected manner to effect dispersion compensation.

Yet another object of the invention is a CTD analog delay line wherein a dispersion compensation transversal filter is connected to the input to provide a signal which is the inverse of the total delay line dispersion.

Still another object of the invention is a BB analog delay line including regenerators therein for providing negative feedback to previous delay stages to apply thereto signals which are the inverse of dispersion associated therewith.

Briefly in accordance with the invention, an improved CTD delay line is provided wherein dispersion components of the output signal are substantially eliminated. In one aspect of the invention, a CTD transversal filter is provided wherein dispersion components of the output signal are substantially eliminated. The tap weights associated with each delay stage of the filter are modified in a preselected manner in order to compensate for dispersion. This configuration is particularly advantageous in that additional circuit components are not required for the compensation.

In accordance with a different aspect of the invention a filter having a system function which is the inverse of the dispersion in a CTD delay line is serially connected to the input of the delay line. In a particular aspect of this embodiment, the filter is defined by an insulated gate field effect transistor configuration including an inverter having a preselectable gain for producing an inverted signal equal to the delay line dispersion. The inverted signal is delayed by one delay stage period, and then applied to the input of the BB analog delay line.

In a further aspect of the invention, a regenerator is inserted in a BB analog delay line to provide compensation for dispersion. The regenerator samples the signal at a selected delay stage, multiplies the signal by a preselected weighting function, and substracts the resultant signal from one or more preceding delay stages. The regenerator can advantageously be defined by an insulated gate field effect transistor configuration. The signal is tapped by the gate electrode of an IGFET, the source-drain electrodes of which are connected in series with an IGFET inverter, the gain of which is variable. The output of the inverter is applied to the storage node of the preceding delay stage.

Other objects, advantages, and uses of the invention will be apparent upon reading the following detailed description of illustrative embodiments in conjunction with the drawings wherein:

FIG. 1 is a block illustration of an analog matched filter having dispersion filter means included therewith;

FIG. 2a graphically illustrates the signal at one stage of an ideal filter;

FIG. 2b graphically illustrates the signal in an analog delay line after N stages, each having a charge transfer loss of α;

Figure 3:
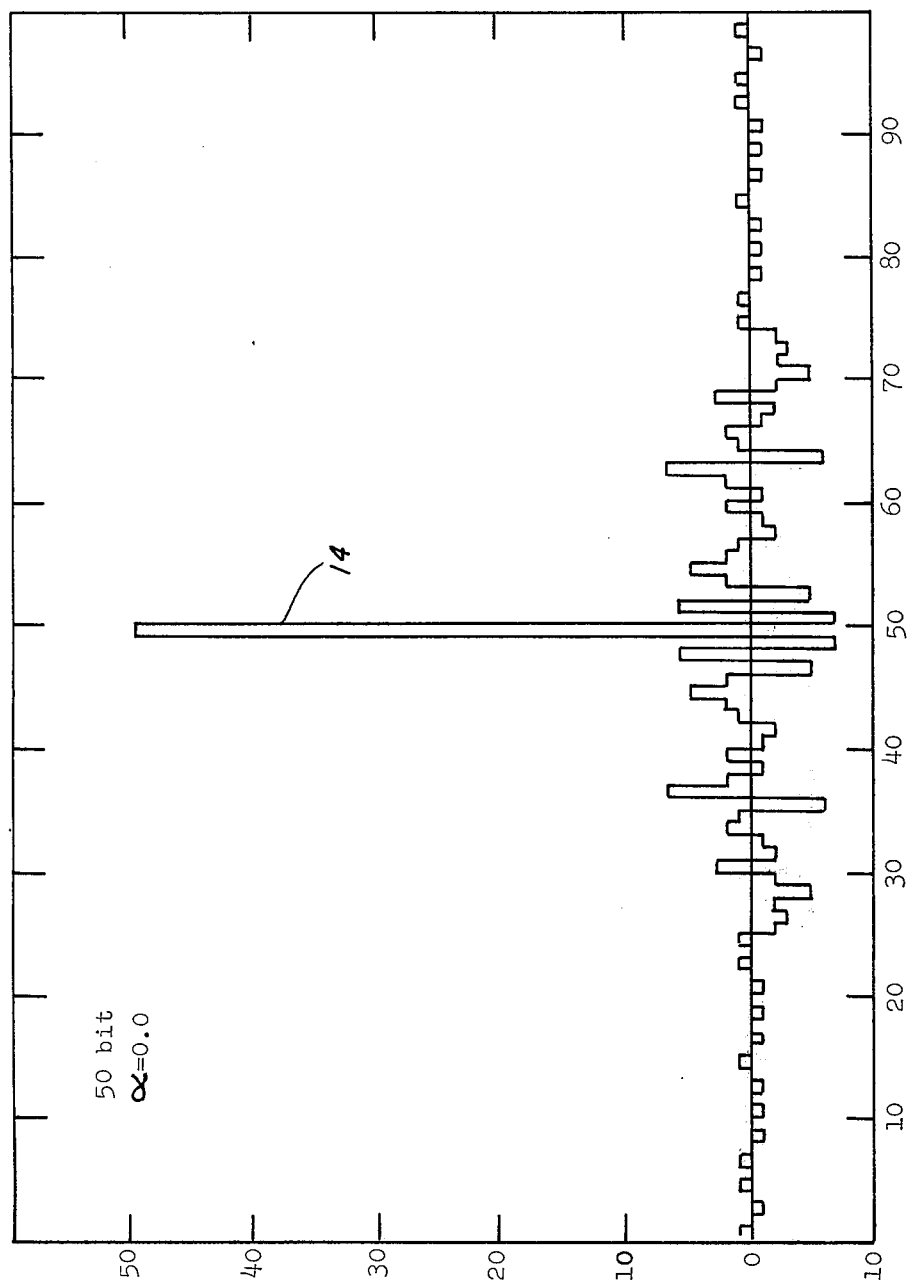
Figure 4:
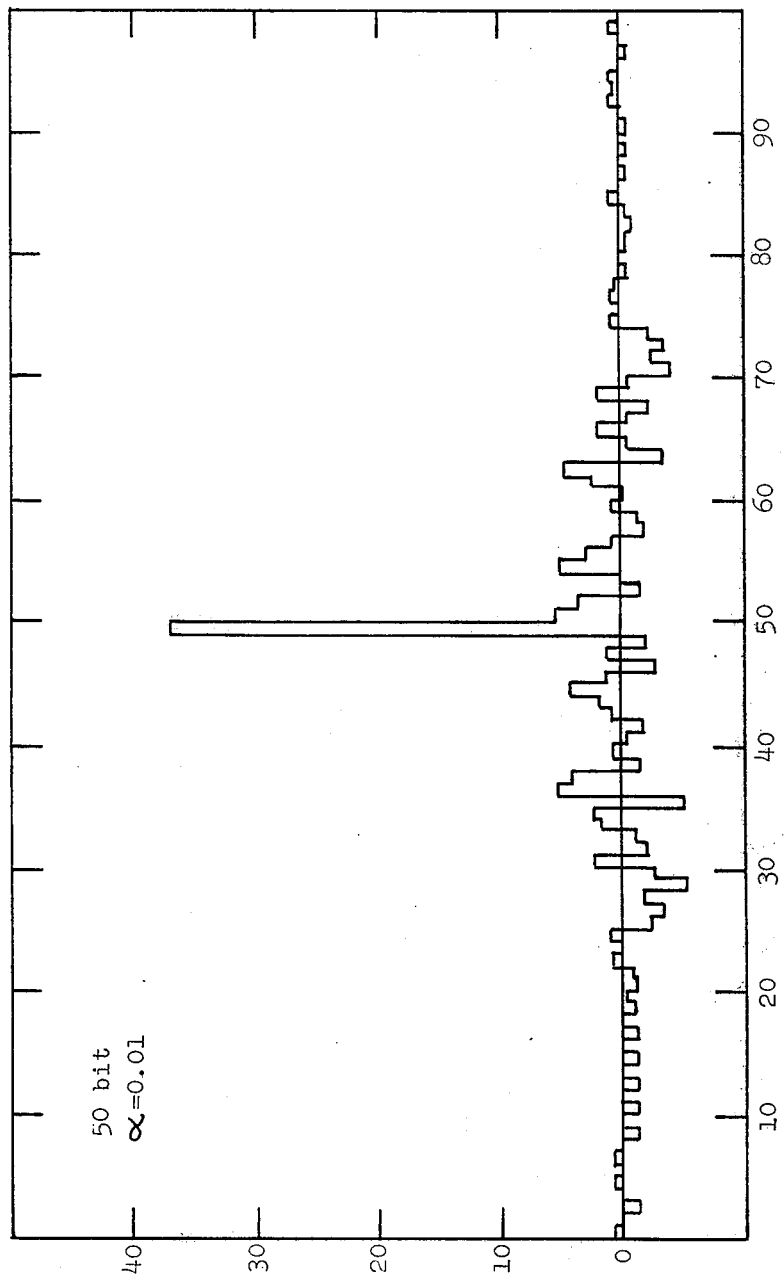
Figure 9:
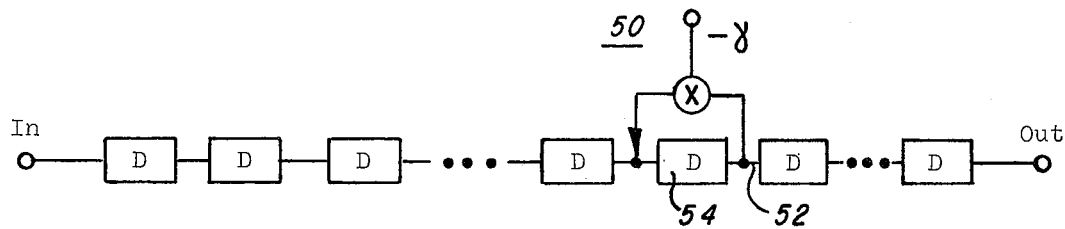
Figure 10:
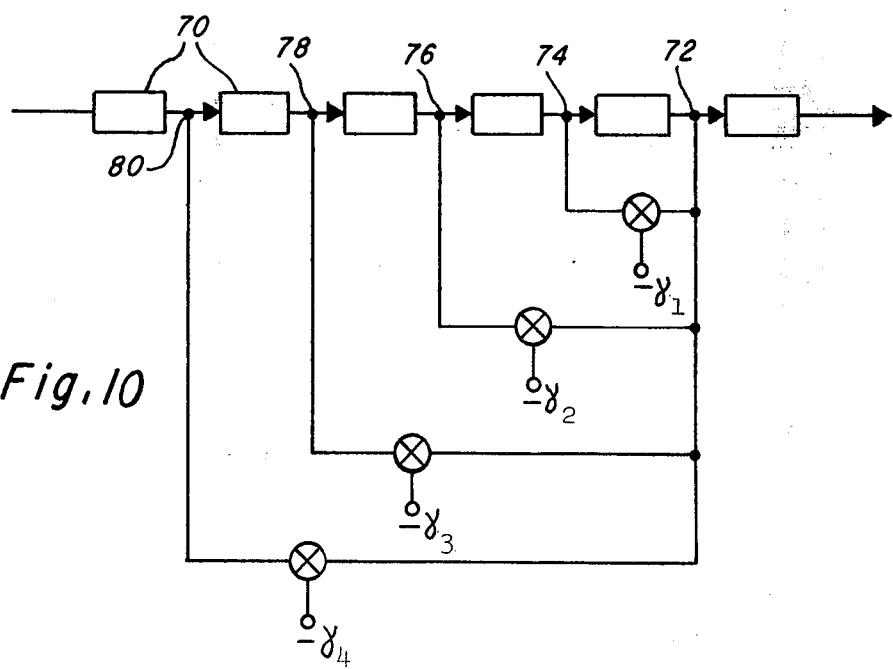

FIG. 3 graphically illustrates the correlated output of an ideal 50 stage filter of a preselected code;

FIG. 4 graphically illustrates the dispersion effects on the output waveform of FIG. 3 for a filter having a charge loss of 1% per stage;

FIG. 5a illustrates in block diagram a 13 stage BB analog matched filter fabricated in accordance with the invention to match a P-N code of ——+++—++—+;

FIG. 5b schematically depicts a typical tapped node of the filter shown in FIG. 5a;

FIGS. 6a and 6b graphically show the impulse and correlated output signals of the analog matched filter of FIG. 5 wherein dispersion is not compensated;

FIGS. 6c and 6d graphically show the impulse and correlated output signals of the analog matched filter of FIG. 5 wherein dispersion is compensated in accordance with the invention;

FIG. 7 is a block diagram illustration depicting connection of a filter having a system output which is the inverse of the delay line dispersion, in series with the delay line;

FIG. 8 is a schematic of a suitable filter for generating an output which is the inverse of the delay line dispersion;

FIG. 9 is a block diagram illustration depicting connection of a regenerator for providing negative feedback to a previous delay stage to compensate for dispersion;

FIG. 10 is a block diagram illustrating negative feedback to a plurality of previous stages to provide higher order compensation correction.

Figure 1:
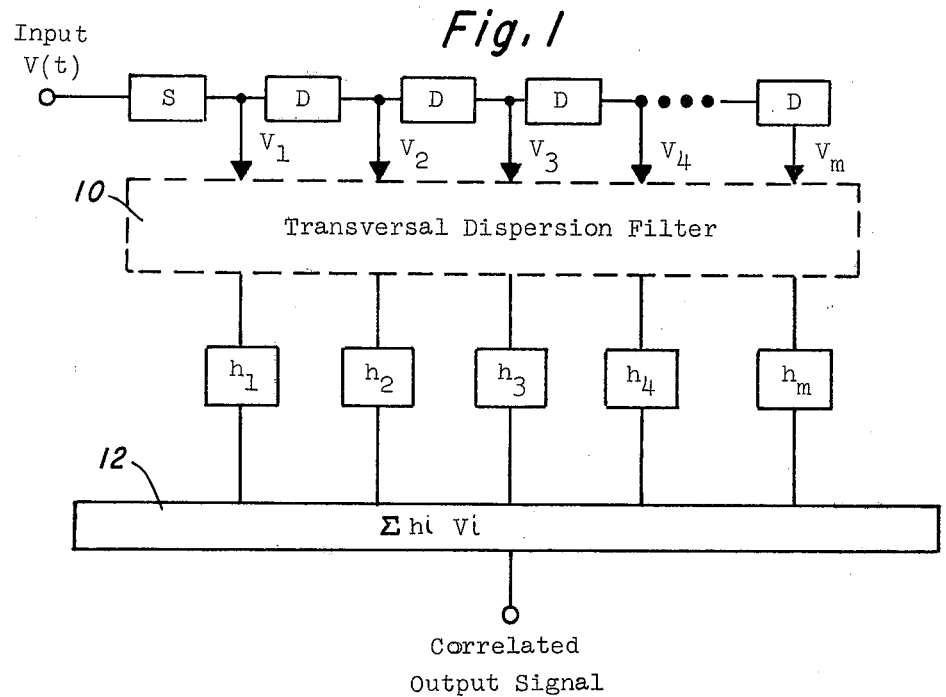

With reference now to the drawings, a circuit configuration for eliminating distortion in an analog matched filter is shown in block diagram in FIG. 1. The matched filter includes a sampling stage S followed by M delay stages D, each of which delays the signal by a time equal to the clock period. The signal is nondestructively sampled at each delay stage, multiplied by the appropriate weighting coefficient $h_k$ ($k = 1, M$), and the weighted signals are summed together to give the filter output. In accordance with the invention, a transversal filter network 10 is connected to each stage of the delay line and transversal filtering is effected to eliminate the dispersion due to charge transfer inefficiency. This is effected by constructing individual filters of the network 10 to have an impulse response which is the inverse of the dispersion. The filters will be different at every tap because the amount of dispersion is different. The filter network can be made to correct to any order in the charge loss parameter α (α = charge lost per stage. α = 2 or 3 times the loss per transfer for a 2 or 3 phase CTD, respectively. It can be seen, however, that a correction to the kth order requires tapping k sequential delay stages. Thus an N stage matched filter corrected to the kth order requires N + k delay stages, each of which is tapped.

The output of the N transversal filters shown generally at 10 are multiplied by the weighting functions $h_i$ and are then added by the summation circuit 12.

Preferably, the transversal filtering function effected by filter network 10 and the weighting function performed by $h_i$ are combined for each stage to define a new weighting function $h_i'$.

By way of illustration, consider the example of a filter matched to the following p-n 50 bit sequences;
+—+—+—+—+——+—+—+——+————+————++—λ
—++————++++———++. The output of an ideal filter when inputted with the correct code, is shown generally in FIG. 3 at graph 14. If a non-ideal device is used, however, degradation of the output occurs, as can be seen with reference to FIG. 4 for a device having charge transfer efficiency of 99.5% per transfer; i.e., a charge loss parameter α = 0.01. It will be noted that the correlation peak has degraded from 50 in the ideal case to 36.48 and the signal to noise improvement achievable has dropped from 50(17 db) to 44.61(16.5 db).

Figures 2A, 2B, 2C:
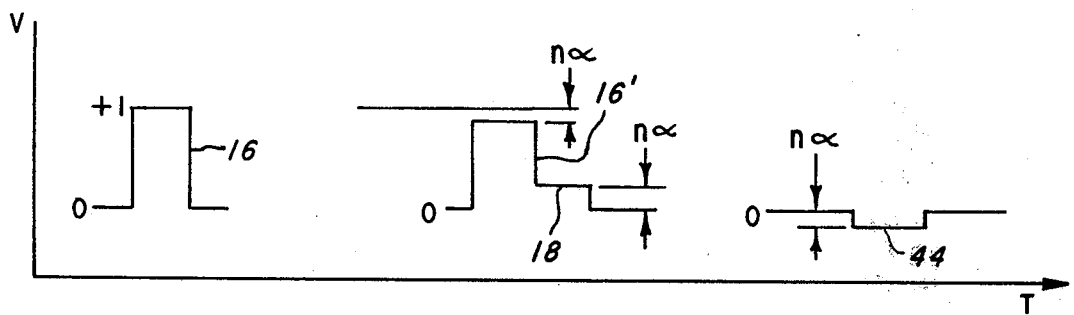
FIG. 2c is a graphic illustration of a signal effective to cancel the dispersion signal component in FIG. 2b.

As noted previously, this degradation results from dispersion. The effect of dispersion on the impulse response at a delay stage of an analog delay line can more readily be seen with reference to FIGS. 2a and 2b. In FIG. 2a a representative signal at the input to an analog delay line is shown at 16. With reference to FIG. 2b this same signal is shown at 16' after a number of stages n wherein each stage has an associated charge loss parameter α. It can be seen that the amplitude of the pulse 16' is less than that of 16 by an amount n α. Further, the signal characteristics are degraded by the trailing edge dispersion signal portion 18.

The dispersion illustrated generally in FIG. 2 can be eliminated in a CTD analog delay line by modifying the weighting functions $h_i$ to a new coefficient $h_i'$ in accordance with a preselected relationship. For example, for the above described p-n matched filter sequence the weighting coefficients for an ideal filter are shown in TABLE 1. The modified coefficients $h_i'$ in accordance with the invention are also shown.

Figure 2D:
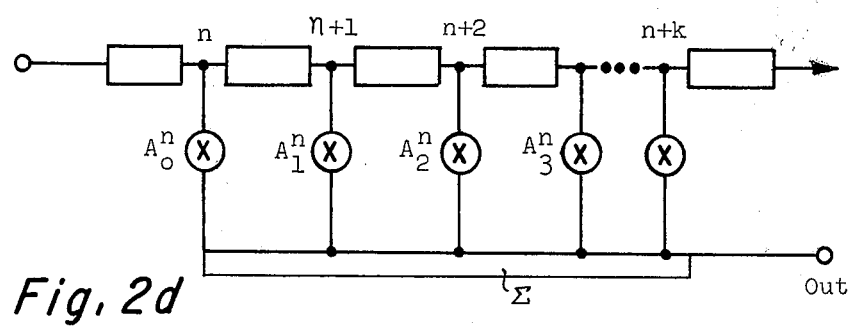
FIG. 2d is a block diagram illustration of a dispersion inverting filter to be connected to the nth node of a delay line for producing dispersion correction to the kth order at that node.

In general, a new set of weighting coefficients $D_n$ are defined. The relationship between these modified weighting coefficients $D_n$ and the weighting coefficients $C_n$ for the ideal dispersionless filter are given by the expression:

$$D_n = \sum_{l=0}^{p} C_{n-l} A_l^{n-l}$$

where p is the smaller of k or n−1, k being the order of dispersion compensation, and n is the number of stages in the filter; and A refers to coefficient weighting values. The value of the A terms can be calculated in the following way. Let $U_l(m)$ be defined by the equation $$U_l(m) = \frac{m!}{l!(m-l)!}(1-\alpha)^l \alpha^{m-l}$$

where
1 < m;
α is the charge loss per transfer
l is an integer
$U_l(m)$ gives the value of signal in the lth storage location when a single signal of unit amplitude has been applied m-1 clock periods. Note that for an ideal device (α=0) $U_l(m) = \alpha_{m,l}$. With reference to FIG. 2d, the $A_l$, coefficients for a filter centered at the $n^{th}$ tap for reconstructing an impulse corrected to the $k^{th}$ order nα can be calculated from the $U_l(m)$ as shown below:

$$A_o{}^n U_n(n) = 1 \tag{1}$$

$$A_o{}^n U_n(n+1) + A_1{}^n U_{n+1}(n+1) = 0 \tag{2}$$

$$A_o{}^n U_n(n+2) + A_1{}^n U_{n+1}(n+2) + A_2{}^n U_{n+2}(n+2) = 0 \tag{3}$$

* * * *

$$A_o{}^n U_n(n+k) + A_1{}^n U_{n+1}(n+k) + \ldots + A_k{}^n U_{n+k}(n+k) = 0 \quad (k+1)$$

From the above equations $A_o{}^n \ldots A_k{}^n$ can be computed by solving Eq (1) for $A_o{}^n$, then solving Eq (2) for $A_1{}^n$ in terms of $A_o{}^n$ etc.

TABLE 1

| Tap No. | $h_i(C_n)$ | $h_i'(D_n)$ |
|---|---|---|
| 1 | +1 | +1.01 |
| 2 | +1 | +1.00 |
| 3 | −1 | −1.06 |
| 4 | −1 | −1.00 |
| 5 | +1 | +1.10 |
| 6 | +1 | +1.00 |
| 7 | +1 | +1.00 |
| 8 | +1 | +1.00 |
| 9 | −1 | −1.19 |
| 10 | −1 | −0.99 |
| 11 | −1 | −1.06 |
| 12 | −1 | −1.00 |
| 13 | +1 | +1.28 |
| 14 | +1 | +0.98 |
| 15 | −1 | −1.32 |
| 16 | −1 | −0.97 |
| 17 | +1 | +1.37 |
| 18 | +1 | +0.96 |
| 19 | −1 | −1.42 |
| 20 | −1 | −0.95 |
| 21 | −1 | −1.00 |
| 22 | −1 | −1.00 |
| 23 | −1 | −1.00 |
| 24 | −1 | −1.00 |
| 25 | −1 | −1.00 |
| 26 | −1 | −1.00 |
| 27 | +1 | +1.62 |
| 28 | −1 | −1.75 |
| 29 | −1 | −0.90 |
| 30 | +1 | +1.70 |
| 31 | −1 | −1.85 |
| 32 | +1 | +1.89 |
| 33 | +1 | +0.86 |
| 34 | −1 | −1.81 |
| 35 | +1 | +2.00 |
| 36 | −1 | −2.04 |
| 37 | +1 | +2.08 |
| 38 | −1 | −2.12 |
| 39 | −1 | −0.79 |
| 40 | +1 | +1.94 |
| 41 | −1 | −2.25 |
| 42 | +1 | +2.30 |
| 43 | −1 | −2.34 |
| 44 | +1 | +2.39 |
| 45 | −1 | −2.43 |
| 46 | +1 | +2.48 |
| 47 | −1 | −2.53 |
| 48 | +1 | +2.58 |
| 49 | −1 | −2.63 |
| 50 | +1 | +2.68 |
| 51 | 0 | −1.06 |
| 52 | 0 | +0.22 |

The output characteristics for the above CTD analog matched filter having weighting coefficients $h_i'$ for correcting dispersion, as compared to an analog filter having no dispersion correction, and an ideal filter are shown in TABLE 2.

TABLE 2

| | Uncorrected | Corrected | Ideal |
|---|---|---|---|
| Signal Amplitude | 36.48 | 50.00 | 50.00 |
| Signal/Noise Improvement | 44.61 | 49.99 | 50.00 |

In accordance with the invention a 13 stage BB matched filter for an 11 Bit Barker code +++ ++ + was constructed using conventional fabrication techniques. The summation configuration is shown generally in FIG. 5a. Delay stages shown generally at 20, respectively comprise. bucket brigade transistor pairs. Each bit was tapped by the gate electrode of an insulated gate field effect transistor 22 (FIG. 5b). The tapped signals are weighted at 24 with a preselected function and the resultant signals were summed on the negative and positive summation busses 26 and 28 by differential amplifier 30. When the charge transfer loss can be predicted, the tap weights to invert dispersion can be designed into the device. When the tapping and summing is being done with source followers as in FIG. 5b, the resistor may be an integrated MOS resistor and its value can be determined either from the width to length ratio or from the bias applied to the gate (see Buss, Bailey & Collins, Electronics Letters 8, 106, (1972)). When the tapping is done using the split electrode technique as is commonly done in CCD filters (Collins, BAiley, Gosney & Buss, Electronics Letters 8, 328, (1972)), the compensating tap weights are implemented by proper positioning of the tap. Either tapping technique can of course be used with either CCD's or BBD's. In the present example the weighting coefficient was effected by an external variable resistor 32 (FIG. 5b). The 13 stage filter with externally adjustable weighting coefficients was matched to the above noted 11 bit Barker code. The device had a charge transfer efficiency (CTE) of 98%, i.e., $d = 0.04$ and the degradation of circuit performance is shown in FIGS. 6a and 6b. In FIGS. 6c and 6d, however, the weighting coefficients were adjusted to effectively invert the dispersion before summation at busses 28 and 30 (FIG. 5a).

With reference now to FIG. 7, an analog delay line 38 having a system function $H(s) = H'(s)e^{-st}$ is illustrated. An ideal delay line, i.e., one without dispersion, has a system function $H(s) = e^{-st}$. A filter 40 is placed in series with the input to the delay line 38. The filter 40 is configured to define a system function $H'^{-1}(s)$. Thus, the dispersion $H(s)$ of the delay line 38 is inverted and applied to the input of the delay line, thereby substantially eliminating dispersion.

With reference to FIG. 8 there is schematically illustrated an insulated gate field effect transistor circuit for defining the filter 40 (FIG. 7). FIG. 8 represents a particularly simple filter having two weighting coefficients. The first coefficients is unity and the second is nagative and has magnitude equal to the gain of the inverter defined by T1, T2 and T10. The summation node for the filter is at 46. This filter inverts dispersion to first order ($k=1$) but the circuit can be developed to correct for higher orders.

An input pulse is sampled by the BB delay line by capacitor $C_1$ responsive to clock $\phi_1$. The input pulse is also applied to the gate electrode of transistor $T_{10}$. Transistors $T_1$, $T_2$ and $T_{10}$ define an inverting amplifier, the gain of which can be selectively controlled by varying the supply $V_C$ connected to the gate of transistor $T_2$. An inverted output at 42 is produced which is the inverse of the delay line dispersion and is gated by transistor $T_3$ onto the capacitor $C_2$ $\phi_2$. By way of illustration, a typical impulse signal after a number of transfers in an analog delay line is shown graphically in FIG. 2b. As previously noted, the effect of dispersion is a trailing edge component 18. The gain of the inverter output 42 is controlled to equal the amplitude of the portion 18, producing a signal 44 shown in FIG. 2c. The trailing edge portion 18 occurs one delay period, i.e., one clock period, after the pulse 16. Thus it can be seen that if the signal 44 is combined with the signal 16 during the delay period immediately following 16, the dispersion will be approximately cancelled at the output of the delay line 38.

Means for delaying by one stage of delay the inventor output stored by capacitor $C_2$ is defined by transistors $T_4$ and $T_5$ and associated clocks $\phi_1$ and $\phi_2$. The inverted signal 44 is applied gated at $\phi_2$ to the storage node 46 one delay stage after the input signal, thereby effectively cancelling delay line dispersion. It will be appreciated of course that initially the signal will be overcompensated, the amount of overcompensation progressively decreasing as the signal propagates along the delay line 38 until at the output the dispersion cancels the inverted signal. Thus, the dispersion compensation circuitry of FIG. 7 is preferably used in analog delay lines, and not filter application where each stage is tapped.

With respect now to FIG. 9 an embodiment of the invention is illustrated wherein a regenerator 50 is defined in a BB analog delay line for providing, to preceding delay stages, negative feedback which is the inverse of dispersion. The regenerator is effective to sample the signal at storage node 52 associated with delay stage 54, multiply the detected signal by a preselected weighting function $\gamma$ to produce a signal value which is the same magnitude as the dispersion of the delay line present at a preceding delay stage, and subtract this signal from the contents of the preceding delay stage. It is appreciated of course that higher order dispersion compensation can be effected by applying appropriately weighted signal portions to several of the preceding delay stages, as shown generally in FIG. 10.

With respect to FIG. 10 there is illustrated in block diagram an analog delay line wherein higher order correction for dispersion is implemented. The delay line is defined by a number of delay stages 70. The signal is sampled at node 72 and is multiplied by preselected weighting functions $-\gamma_1$, $-\gamma_2$, $-\gamma_3$ and $-\gamma_4$. These weighted signals are then applied as negative feedback to storage nodes 74, 76, 78 and 80 associated with respective preceding storage nodes.

While the invention has been described in detail with respect to illustrative embodiments, it will be apparent to those skilled in the art that various changes can be made without departing from the spirit or scope of the invention.

What is claimed is:

1. A charge transfer device analog delay line having a series of delay stages, each characterized by a predetermined delay and means for shifting input signals between said delay stages, said delay line having an output substantially free from charge transfer loss dispersion, comprising:
   input means connected to said delay line for receiving input signals and for applying said input signals to a first delay stage of said delay line;
   first circuit means connected to said input means for generating, responsive to a said input signal, a dispersion compensation output singal having an amplitude equal to the inverse of the total dispersion of said delay line; and
   second circuit means operable to delay said dispersion compensation output signal and to apply said delayed dispersion compensation output signal to said first delay stage of said delay line delayed by said predetermined delay relative to application of said input signal by said input means to said first delay stage of said delay line for combination with an input signal at said first delay stage.

2. A charge transfer analog delay line having an output substantially free from charge transfer loss dispersion as set forth in claim 1, wherein said first circuit means comprise an insulated gate field effect transistor inverter having a preselected gain which is effective to cancel total delay line dispersion to first order in charge transfer loss.

3. A charge transfer analog delay line having an output substantially free from charge transfer loss dispersion as set forth in claim 2, wherein said inverter comprises first and second insulated gate field effect transistors having channels connected in series between circuit ground and bias means, said first transistor having a gate connected to said input means, and a load impedance connecting the channel of said second transistor to said bias means, said second transistor having a gate disposed for selecting a preselected bias such that the output voltage at the juncture of said load impedance and the channel of said second transistor is substantially equal to said delay line dispersion to first order, and means connecting said juncture to said second circuit means.

4. A charge transfer device analog delay line having an output substantially free from charge transfer loss dispersion as set forth in claim 3 wherein said input means includes first and second storage nodes, said second storage node connected to the first delay stage of said delay line, and said first circuit means further includes:
   a storage capacitor; and
   a gating transistor connecting said storage capacitor and said juncture between said second transistor and said load impedance; whereby
   responsive to a first clock phase applied to said gating transistor, said inverter output is coupled to said storage capacitor simultaneously with said input signal being stored at said first storage node of said input means, said input signal being transferred to the second storage node of said input means during a second clock phase.

5. A charge transfer device delay line having an output substantially free from charge transfer loss dispersion as set forth in claim 4, wherein said second circuit means is connected to said storage capacitor, and comprises a pair of insulated gate field effect transistors defining a delay stage characterized by delay equal to the delay of a delay stage of said delay line, said inverter output signal being transferred into said second circuit means delay stage responsive to said second clock phase, said second circuit means further including a gating transistor connecting the output of said second circuit means delay stage to said second storage node of said input means responsive to the next succeeding second clock phase.

6. A charge transfer device analog delay line having a plurality of charge storage nodes and means for shifting input signals between said storage nodes, said delay line having an output signal substantially free from charge transfer loss dispersion comprising:
   amplifier means for non-destructively sampling the signal at a selected storage node of said shift register and combining said sampled signal with an input signal at a preceding shift register storage node, said amplifier having a preselected gain effective to cancel the trailing edge dispersion signal components to first order in loss.

7. A charge-transfer device analog delay line having a plurality of charge storage nodes and means for shifting input signals between said storage nodes, said delay line characterized by a predetermined charge dispersion during shifting of said input signals between said storage nodes, and having an output substantially free from dispersion, comprising:

correction circuit means having input means connected to at least one of said storage nodes for generating a correction signal related to the signals at said one storage node, and having output means connected to at least one other of said storage nodes for applying said correction signal to said other storage node for modifying said shifted signals by a correction factor to substantially cancel charge dispersion from the output from said delay line.

8. A charge transfer device analog delay line including an input node, an output node, and a plurality of charge storage nodes defined between said input node and said output node, and means for shifting input signals between said storage nodes from said input node to said output node, said delay line characterized by a predetermined charge dispersion during shifting of said input signals between said storage nodes, comprising:

dispersion compensation means including means for non-destructive detection of signals at said input node, and signal weighting means connected to apply a weighted signal derived from said means for detection to at least one of said charge storage nodes for modifying said shifted signals by a correction factor to compensate for charge dispersion at said output node.

* * * * *